United States Patent
Lee

[11] Patent Number: 6,157,074
[45] Date of Patent: Dec. 5, 2000

[54] LEAD FRAME ADAPTED FOR VARIABLE SIZED DEVICES, SEMICONDUCTOR PACKAGE WITH SUCH LEAD FRAME AND METHOD FOR USING SAME

[75] Inventor: Hyeon Il Lee, Kyungsangbuk-do, Rep. of Korea

[73] Assignee: Hyundai Electronics Industries Co., Ltd., Ichon-shi, Rep. of Korea

[21] Appl. No.: 09/094,564

[22] Filed: Jun. 15, 1998

[30] Foreign Application Priority Data

Jul. 16, 1997 [KR] Rep. of Korea ............... 97/33164
Nov. 14, 1997 [KR] Rep. of Korea ............... 97/60054

[51] Int. Cl.[7] .................. H01L 23/48; H01L 23/495; H01L 23/28
[52] U.S. Cl. .................. 257/666; 257/676; 257/696; 257/668; 257/674; 257/670; 257/669; 257/672; 257/673
[58] Field of Search .................. 257/666, 676, 257/674, 673, 672, 696, 698, 671, 669, 670

[56] References Cited

U.S. PATENT DOCUMENTS

| | | | |
|---|---|---|---|
| 4,380,042 | 4/1983 | Angelucci, Sr. et al. | 361/421 |
| 4,857,989 | 8/1989 | Mori et al. | 257/666 |
| 4,884,124 | 11/1989 | Mori et al. | 257/783 |
| 4,942,454 | 7/1990 | Mori et al. | 257/676 |
| 5,134,459 | 7/1992 | Maeda et al. | 257/666 |
| 5,424,576 | 6/1995 | Djennas et al. | 257/666 |
| 5,428,248 | 6/1995 | Cha | 257/676 |
| 5,471,088 | 11/1995 | Song | 257/668 |
| 5,554,886 | 9/1996 | Song | 257/666 |
| 5,559,366 | 9/1996 | Fogal et al. | 257/666 |
| 5,623,123 | 4/1997 | Umehara | 174/52.2 |
| 5,635,755 | 6/1997 | Kinghorn | 257/666 |
| 5,637,913 | 6/1997 | Kajihara et al. | 257/666 |
| 5,646,829 | 7/1997 | Sota | 361/813 |
| 5,683,944 | 11/1997 | Joiner et al. | 257/676 |
| 5,708,295 | 1/1998 | Oga et al. | 257/676 |
| 5,710,456 | 1/1998 | Abbott et al. | 257/666 |
| 5,767,572 | 6/1998 | Fugitsu | 257/668 |
| 5,834,831 | 11/1998 | Kubota et al. | 257/674 |
| 5,834,837 | 11/1998 | Song | 257/692 |
| 5,847,446 | 12/1998 | Park et al. | 257/676 |
| 5,859,471 | 1/1999 | Kuraishi et al. | 257/666 |
| 5,889,317 | 3/1999 | Huang et al. | 257/666 |
| 5,898,220 | 4/1999 | Ball | 257/723 |
| 5,929,514 | 7/1999 | Yalamanchili | 257/676 |
| 5,932,924 | 8/1999 | Diana et al. | 257/676 |
| 5,949,138 | 9/1999 | Palasi et al. | 257/712 |
| 6,020,625 | 2/2000 | Qin et al. | 257/61.6 |

Primary Examiner—Alexander O. Williams
Attorney, Agent, or Firm—Fleshner & Kim, LLP

[57] ABSTRACT

A lead frame and a semiconductor package using the lead frame are disclosed in which one lead frame can be used to perform the package process regardless of the size of a chip. The size of the chip can be varied within the limit that the number of bonding pads of the chip does not exceed the number of corresponding inner leads. The lead frame includes a plurality of tie bars extended toward the center from edges of a lead frame body, a die pad supported by the tie bars on which a semiconductor chip can be bonded and a plurality of inner leads disposed around the die pad. The tie bars, the die pad and the inner leads are preferably in the same plane. The inner leads are electrically coupled with bonding pads of the chip. A plurality of outer leads respectively coupled with the inner leads and exposed outside a molded package.

17 Claims, 11 Drawing Sheets coining
Ag-plating down set

6,157,074

LEAD FRAME ADAPTED FOR VARIABLE SIZED DEVICES, SEMICONDUCTOR PACKAGE WITH SUCH LEAD FRAME AND METHOD FOR USING SAME

BACKGROUND OF THE INVENTION

1. Field of the Invention

The present invention relates to a semiconductor package, and more particularly, to a lead frame and a semiconductor package with such lead frame.

2. Background of the Related Art

Generally, a lead frame is a metal structure for use in packaging a semiconductor chip. The lead frame is usually made of copper alloy.

FIG. 1 is a diagram showing plane view of a related art quad flat package (QFP) type lead frame. As shown in FIG. 1, a lead frame 21a includes a guide rail 34, a die pad 24, a plurality of inner leads 26 and a plurality of outer leads 27. The guide rail 34 is formed at lower and upper sides of the lead frame 21a to support the overall lead frame structure and guides the lead frame 21a during feeding. The die pad 24 (i.e., a paddle) is formed at the center of the lead frame 21a for mounting a semiconductor chip 23. The die pad 24 is connected to tie bars 22a to be supported by the tie bars 22a, and the die pad 24 is lower than the other portions of the lead frame 21a. The tie bars 22a are extended from edges, for example corners, of the lead frame 21a.

In other words, some portions of the tie bars 22a are bent with a predetermined slope to allow the die pad 24 to be more down-set than the inner leads 26. A gap is formed between the die pad 24 and the inner leads 26. Front ends of the inner leads 26 are disposed around the die pad 24. The outer leads 27 are formed at opposite ends of the inner leads 26 to respectively correspond to the inner leads 26.

A dam bar 28 is formed between the corresponding inner and outer leads 26 and 27. The dam bar 28 is molded by an epoxy molding compound EMC) and then removed during trimming.

The process for making a package with the lead frame 21a will now be described. Dicing of chips on a wafer is performed after a fabrication process for forming an integrated circuit on the wafer. Chip bonding is then performed to mount the chips on the die pad 24 of the lead frame. Wire bonding is performed to electrically connect a bonding pad 25 on the chip 23 with the inner lead 26 of the lead frame 21a using a gold wire 30. Then, molding is performed to shield the chip 23 and the gold wire 30.

After the molding process, trimming is performed to cut the tie bars 22a and the dam bar 28 of the lead frame 21a. Then, forming is performed to form the outer leads 27 to a predetermined form, and soldering is performed. Thus, a semiconductor package as shown in FIG. 2 can be obtained.

However, the related art lead frame 21a has problems in that a lead frame depends on the size of a chip. In other words, when the size of a chip is larger than the die pad, a lead frame having a new die pad corresponding to the size of the chip is designed and fabricated.

Since the die pad 24 is down-set to be disposed lower than the inner lead 26, tips of the inner leads 26 prevent the chip from being mounted on the die pad 24 if the chip 23 is larger than the tip area between the inner leads 26. In addition, the edges of the chip 23 can shield the bonding area of the inner lead 26 to prevent wire bonding. Thus, the size of the chip can only be changed within the range that the chip 23 does not contact with the tip of the inner lead 26 as shown in a dotted line of FIG. 2. Accordingly, it is difficult to use chips having various sizes within the lead frame 1a.

FIGS. 3 and 4 show related art padless lead frame disclosed in U.S. Pat. No. 5,554,886. In FIGS. 3 and 4, edges of a chip 23 are disposed on the inner leads 26.

However, the related art padless lead frame is for a dual in-line package type lead frame 31b and has problems because it is difficult or impossible to fabricate a high pin count package such as the QFP type lead frame 21a. Further, since the lead frame 31b has no die pad, it is difficult or impossible to mount a chip that is smaller than an inner area of inner leads 36. In other words, the related art padless lead frame 31b can be used only to package a chip that is larger than the tip of the inner leads 36 and is not applicable to package a chip smaller than the tip of the inner leads 36. In addition, in the package process, the related art padless lead frame has a problem that lead frames having various sizes should separately be provided depending on the size of the chip to allow distances between the inner leads 36 to be different.

The above references are incorporated by reference herein where appropriate for appropriate teachings of additional or alternative details, features and/or technical background.

SUMMARY OF THE INVENTION

An object of the present invention is to provide a lead frame and a semiconductor package with such a lead frame that substantially obviate one or more of the problems caused by limitations and disadvantages of the related art.

Another object of the present invention is to provide a lead frame and a semiconductor package with such a lead frame in which one lead frame can be used to perform the package process regardless of the size of a chip within the range that the number of bonding pads of the chip does not exceed the number of corresponding inner leads.

To achieve at least these objects and other advantages in a whole or in parts and in accordance with the purpose of the present invention, as embodied and broadly described, a lead frame according to the present invention includes a plurality of tie bars extended toward the center from edges of a lead frame body, a die pad disposed on the same plane as the tie bars to be supported by the tie bars, on which a semiconductor chip is bonded, a plurality of inner leads disposed around the die pad on the same plane as the die pad and electrically coupleed with bonding pads of the chip which is bonded on the die pad by means of wire bonding, a plurality of outer leads respectively coupled with the inner leads and exposed to outside during molding, and a dam bar formed between the inner leads and the outer leads.

To further achieve the above objects in a whole or in parts, a semiconductor package according to the present invention includes a plurality of outer leads, a plurality of inner leads internally extended from the outer leads, a die pad disposed in an inner area of a line connecting front ends of the inner leads to be on the same plane as the inner leads, a semiconductor chip bonded to the die pad with an area smaller than the inner area the line connecting the front ends of the inner leads, having a plurality of bonding pads for use as an outer connection terminal electrically coupled with the inner leads, a bonding member for bonding the chip to the die pad, connecting members for electrically coupling the bonding pads of the chip with the inner leads, and a mold body for sealing the overall structure except for the outer leads.

To further achieve the above objects in a whole or in parts, a semiconductor package according to the present invention includes a plurality of outer leads, a plurality of inner leads respectively extended from the outer leads, a die pad disposed in an inner area of a line connecting front ends of the inner leads on the same plane as the inner leads, a semiconductor chip bonded on the die pad with an area larger than the inner area connecting the front ends of the inner leads to allow its edges to overlap the inner leads, having a plurality of bonding pads electrically coupeled with the inner leads, a bonding member for bonding the chip to the die pad, connecting members for electrically coupling the bonding pads of the chip with the inner lead, and a mold body for sealing the overall structure except for the outer leads.

To further achieve the above objects in a whole or in parts, a semiconductor package according to the present invention includes a plurality of outer leads, a plurality of inner leads down-set to be lower than the outer leads, a die pad disposed in an inner area of the inner leads, a semiconductor chip bonded on the die pad (to allow its edges to overlap the inner leads) having a plurality of bonding pads electrically coupled with the inner leads, a bonding member doped on the die pad to bond the chip to the die pad, connecting members for electrically coupling the bonding pads of the chip with the inner leads, and a mold body for sealing the overall structure except for the outer leads.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
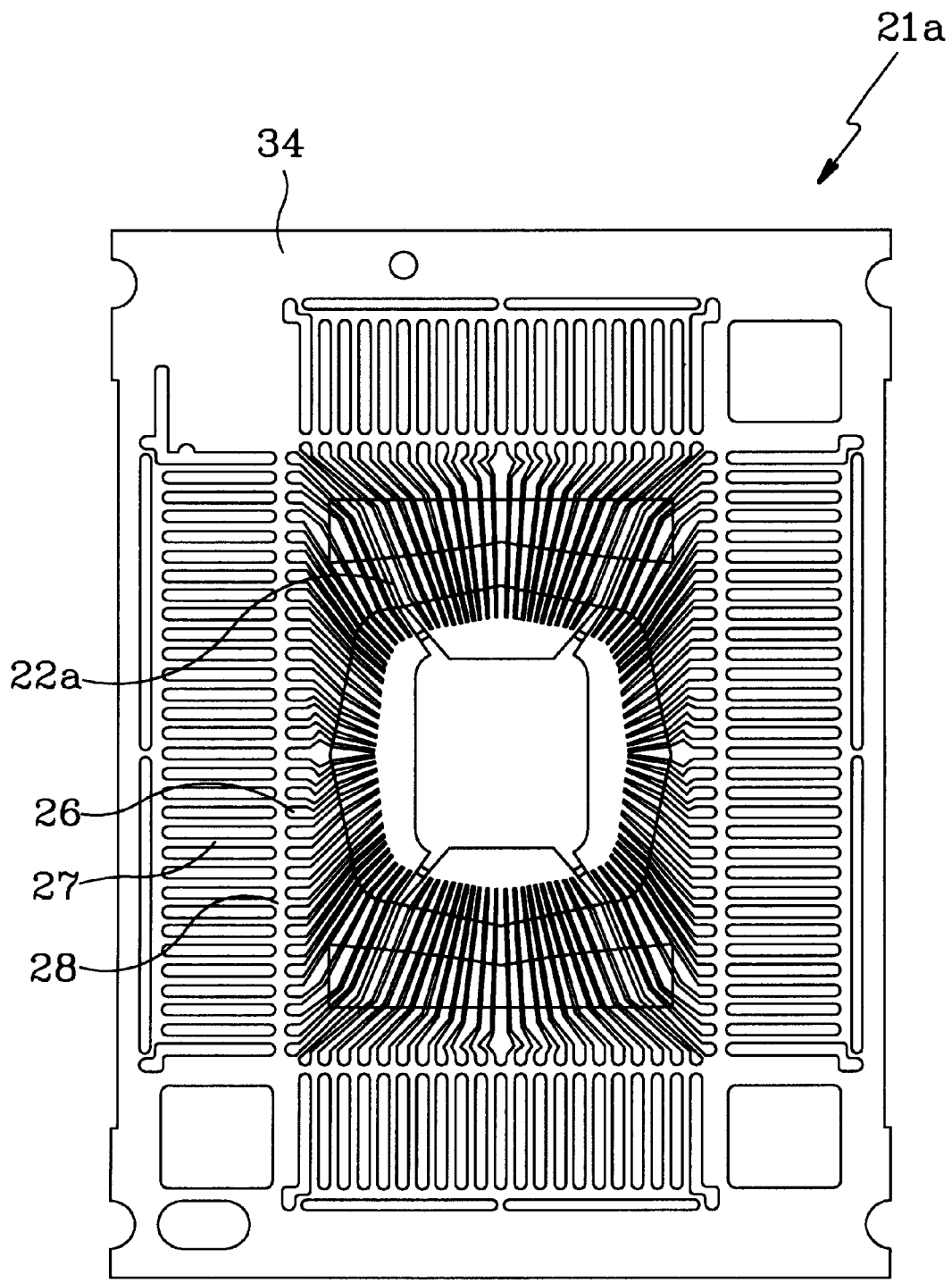
FIG. 1 is a diagram showing a plane view of a related art QFP type lead frame.
Figure 2:
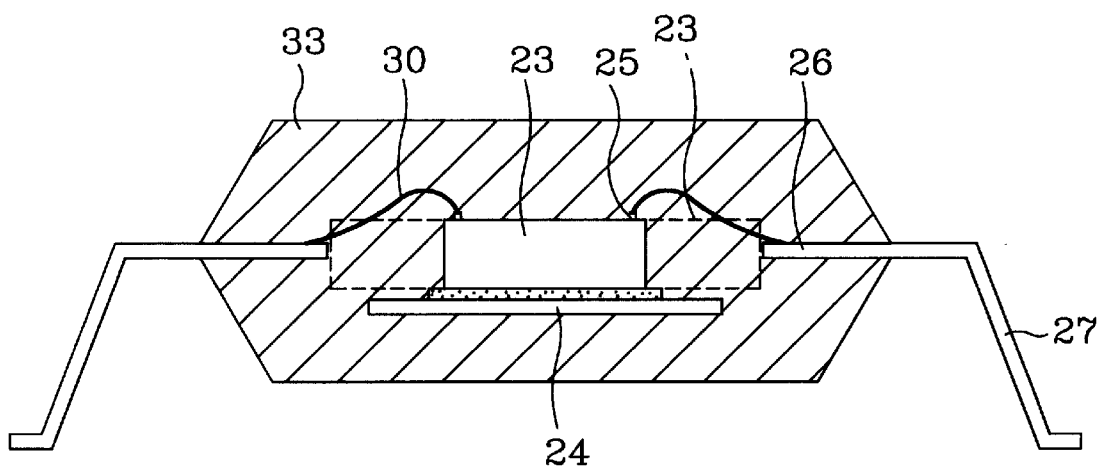
FIG. 2 is a diagram showing a longitudinal cross-section of a semiconductor package with the lead frame of FIG. 1.
Figure 3:
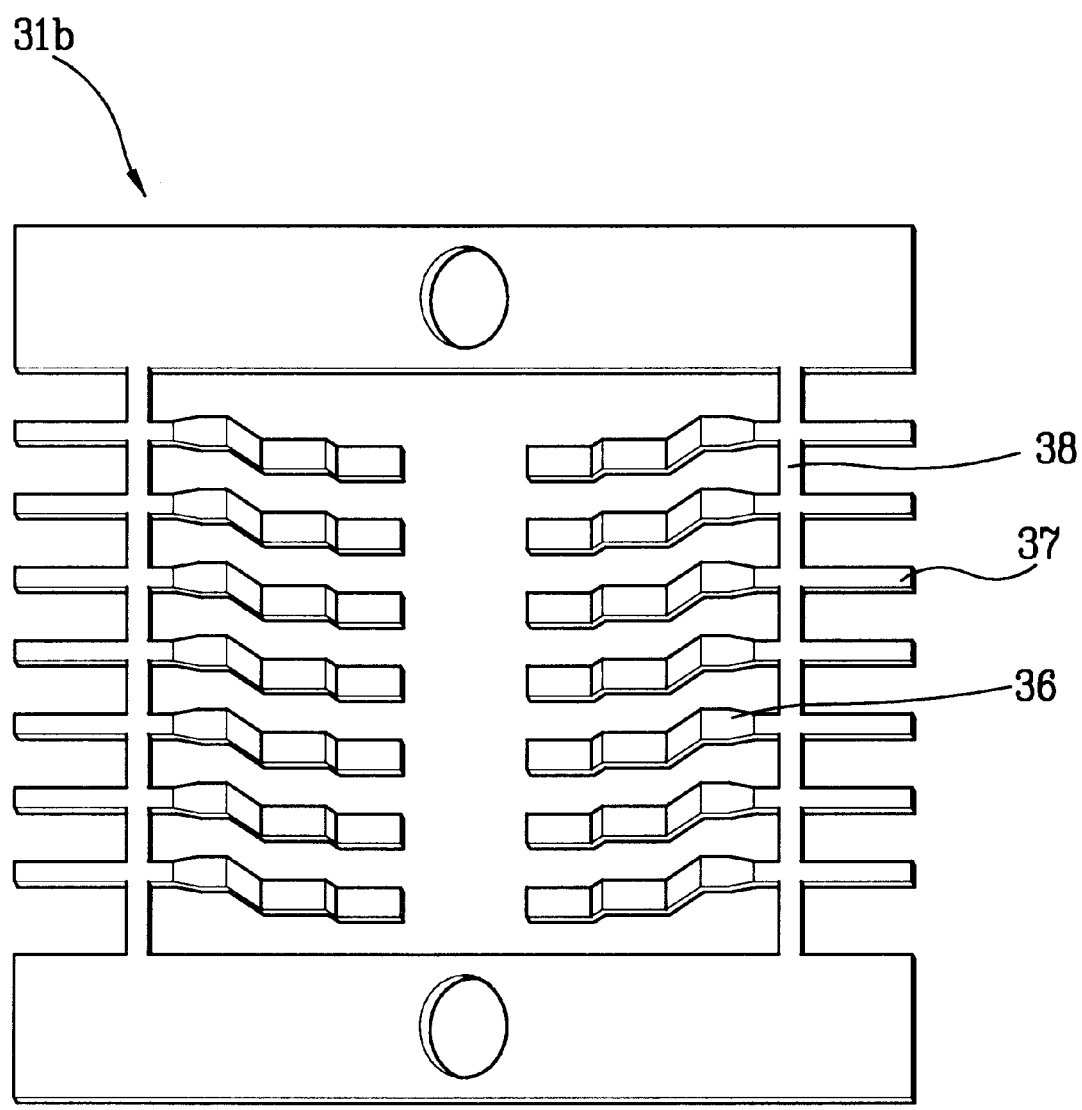
FIG. 3 is a diagram showing a plane view of a related art padless lead frame.
Figure 4:
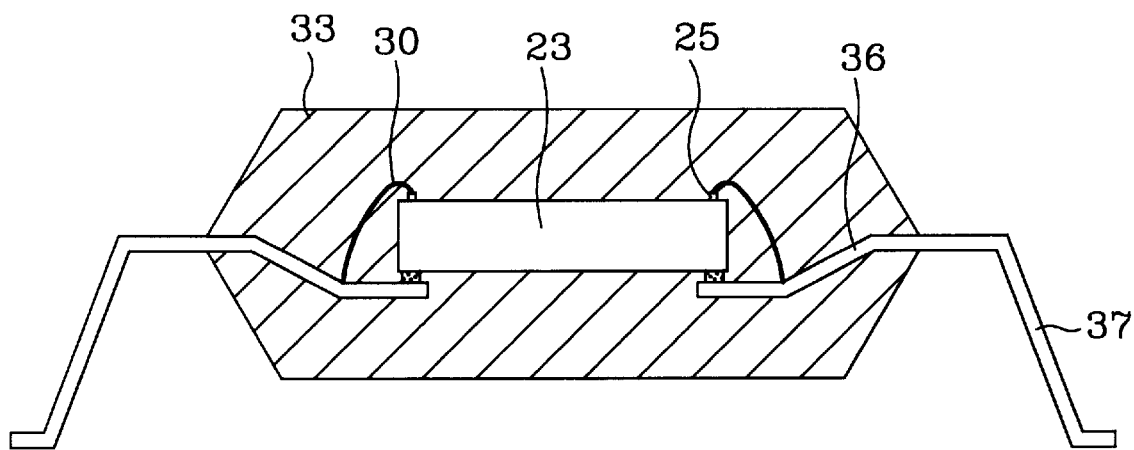
FIG. 4 is a diagram showing a longitudinal cross-section of a semiconductor package with the padless lead frame of FIG. 3.
Figure 5:
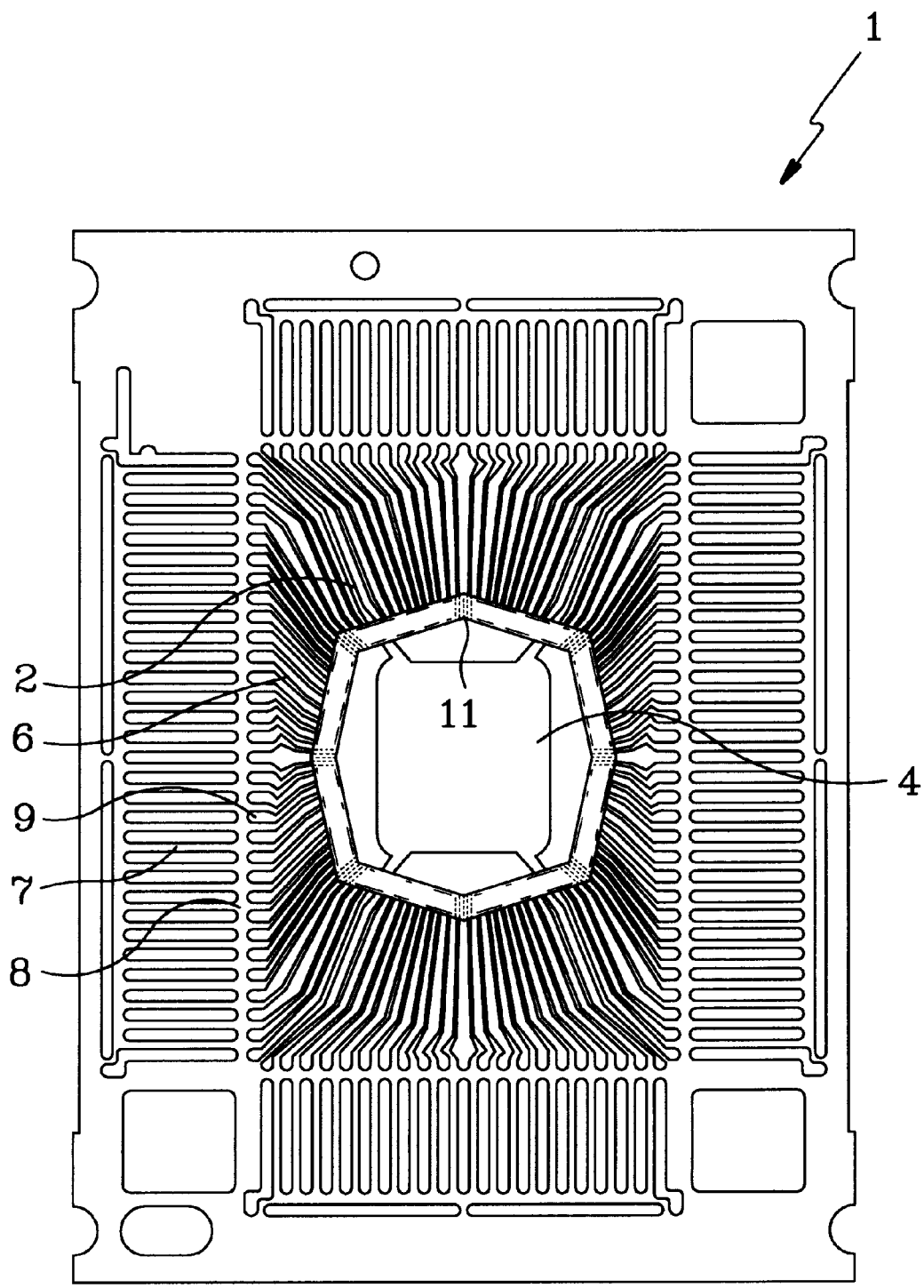
FIG. 5 is a diagram showing a plane view of a preferred embodiment of a lead frame according to the present invention.

As shown in FIG. 5, a lead frame 1 according to a first preferred embodiment of the present invention includes a plurality of tie bars 2 extended toward a center from edges of a lead frame body and a die pad 4 coupled with the tie bars 2 to be supported by the tie bars 2. A semiconductor chip 3 can be bonded on the die pad 4. A plurality of inner leads 6 are disposed around the die pad 4 and electrically coupled with bonding pads 5 of the chip 3 preferably by means of wire bonding. A plurality of outer leads 7 are respectively coupled to the inner leads 6 and exposed outside a mold body 13 such as a molded package, and a dam bar 8 is formed between the inner leads 6 and the outer leads 7. The inner leads 6, the tie bars 2, and the die pad 4 are preferably disposed on the same plane as one another.

Figure 6:
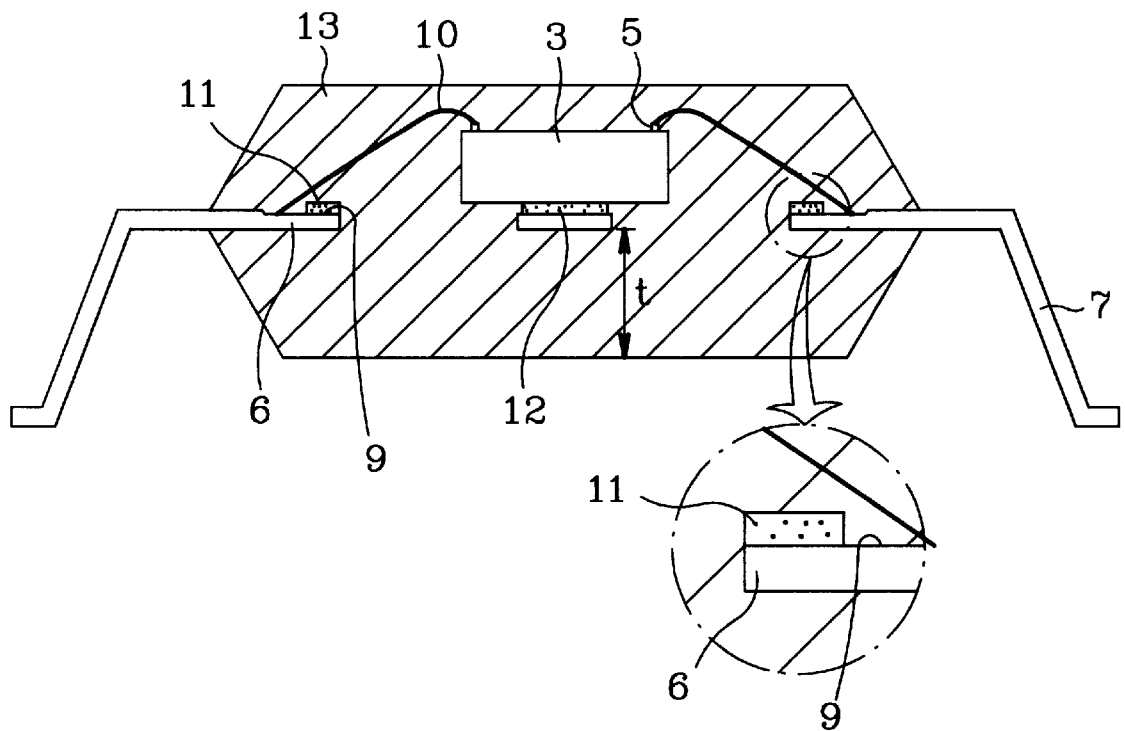
FIG. 6 is a diagram showing a longitudinal cross-section of a semiconductor package with the lead frame of FIG. 5.

As shown in FIG. 6, coining is preferably performed in the inner leads 6 at a sufficient width W to form a step or a coined surface 9. An insulating member 11 is formed with a prescribed thickness, which is as small as possible, to improve bonding with an epoxy 12 doped on the die pad 4. Thus, preferably the insulating member 11 attached to the inner lead 6 has the same height as the epoxy 12 doped on the die pad 4 during the packaging process.

Bonding between the coined surface of the inner leads 6 and one end of a gold wire is preferably enhanced by means of wire bonding to electrically couple the bonding pad 5 of the chip 3 with the inner lead 6. Thus, the gold wire serves as an exemplary example of a connecting member 10.

The coined surface of the inner lead 6 is plated with a metal thin film having excellent electric conductivity. Ag is preferably used as the metal thin film. In other words, Ag-plating is performed in the front end of the inner lead 6. The tie bar 2 is not plated with Ag to preferably further distinguish the tie bar 2 from the inner lead 6 during wire bonding.

Figure 8:
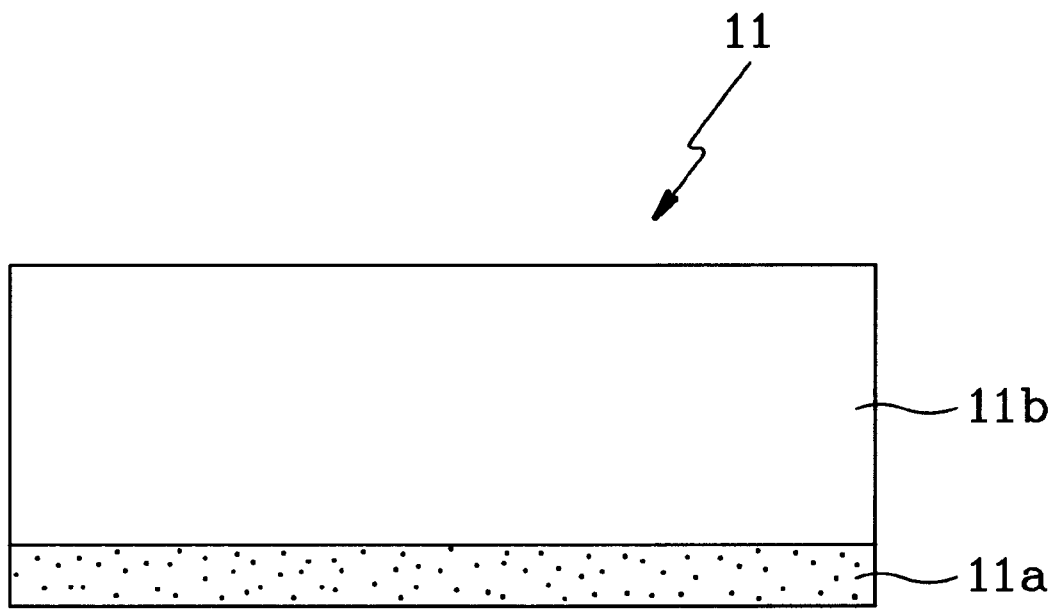
FIG. 8 is a diagram showing a cross-section of an insulating member in FIG. 6.

FIG. 8 is a diagram showing a sectional view of the insulating member of FIG. 6. The insulating member 11 is attached on the coined surface 9 of the inner lead 6 to prevent the chip 3 from being electrically coupled with the inner lead 6 and to prevent the inner lead 6 from moving during wire bonding. The insulating member 11 preferably includes a bond layer 11a of polyimide, which can be attached on the coined surface 9 of the inner lead 6, and an insulating film 11b attached on the bond layer 11a. The insulating member 11 is attached to only the inner lead 6. Preferably the coining depth of the inner lead 6 is 15~20 $\mu$m and the coining width is larger than the insulating member 11.

Preferably the insulating member 11 has a thickness of 75 $\mu$m or below and a width of 1~1.5 mm. At this time, the bond layer 11a has a thickness of 25 $\mu$m or below and the insulating film has a thickness of 50 $\mu$m or below. The epoxy 12 is doped on the die pad 4 at a thickness of 8~35 $\mu$m. The epoxy 12 includes a flake, such as Ag, having electric conductivity and thermal conductivity.

In actual fabrication process, the thickness of the epoxy, the thickness of the insulating member, and the coining depth are preferably varied within the above ranges, but in particular, so that the insulating member 11 attached to the inner lead 6 is disposed on the same plane as the epoxy 12 doped on the die pad 4. Thus, one lead frame can be used regardless of the size of the chip within the range that the number of the bonding pads formed on the chip does not exceed the number of the corresponding inner leads, which is preferable from both economical and production point of views.

A packaging process of a semiconductor chip using the first preferred embodiment of the lead frame according to the present invention will now be described. Dicing of chips 3 on a wafer is performed after a fabrication process for forming an integrated circuit on the wafer.

Figure 7:
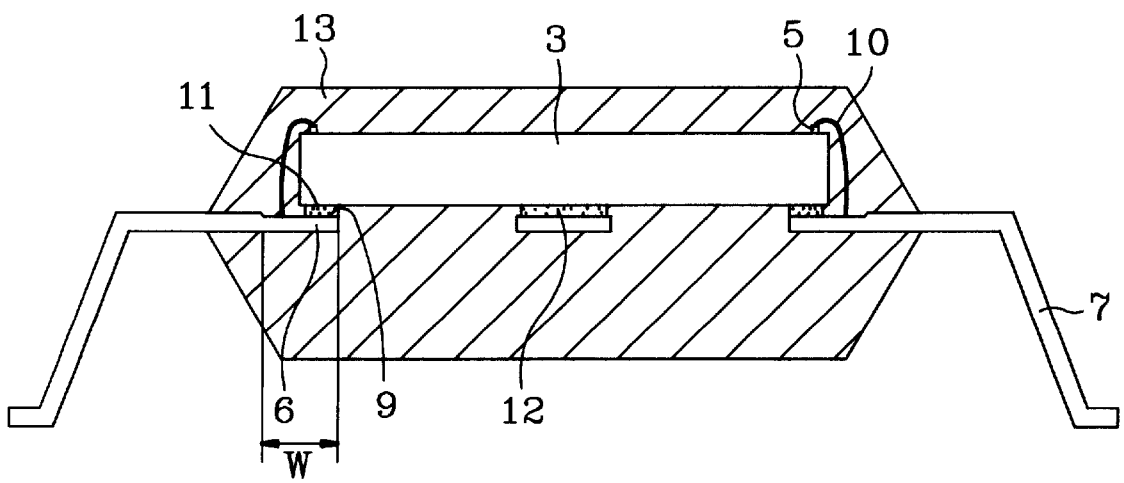
FIG. 7 is a diagram showing a longitudinal cross-section of another semiconductor package with the lead frame of FIG. 5.

As shown in FIG. 7, each of the chips 3 is mounted on the lead frame 1. Chip bonding is performed for mounting the chip 3 on the die pad 4 or mounting the chip 3 on the die pad 4 and the inner lead 6 at the same time.

As shown in FIG. 6, if the semiconductor chip is smaller than the die pad 4 or smaller than an inner area, which can be defined by a line connecting front ends of the inner leads 6, the semiconductor chip is disposed at the inner side of the line connecting the front ends of the inner lead 6. As shown in FIG. 7, if the semiconductor chip is greater in size than the inner area of the line connecting the front ends of the inner leads 6, the semiconductor chip is mounted on the die pad 4 to overlap the front ends of the inner lead 6. Then, the insulating member 11 is attached to the inner lead 6 and the Ag-epoxy 12 is doped on the die pad 4.

Subsequently, wire bonding is performed to electrically coupled an outer connection terminal (e.g., the bonding pad 5 formed on the chip 3) with the inner lead 6 of the lead frame 1. Then, molding is performed to shield the chip 3 and the bonded connecting member.

After the molding process, trimming is performed to cut the tie bar 2 and the dam bar 8 of the lead frame 1, and forming is performed to form the outer lead 7 to a prescribed form. Soldering is performed to complete the package process of the semiconductor chip.

The front end of the inner lead 6 is coined to form a step and at the same time to be flattened. In this state, the insulating member 11 is attached to the coined surface 9 of the inner lead 6. Preferably, the insulating member 11 attached to the inner lead 6 is disposed on the same plane as the epoxy 12 doped on the die pad 4. For this, a sum of the thickness of the inner lead 6 having the coined surface 9 and the thickness of the insulating member 11 should be equal to the sum of the thickness of the die pad 4 and the thickness of the epoxy 12 doped on the die pad 4. Since the coined surface 9 of the inner lead 6 is lower than the other portions, the insulating member 11 preferably has a thickness as thin as possible to improve bonding with the epoxy 12 doped on the die pad 4.

FIG. 6 is a longitudinal cross-section of a first semiconductor package with the first preferred embodiment of a lead frame where the size of a chip is smaller than the inner area of the inner leads 6. The semiconductor package includes the plurality of outer leads 7, the plurality of inner leads 6 extended from each of the outer leads 7, the die pad 4 disposed within an inner area of a line connecting front ends of the inner leads 6 and a semiconductor chip 3 bonded on the die pad 4. The semiconductor chip 3 has a plurality of bonding pads 5 electrically coupled with the inner leads 6. The epoxy 12 is doped on the die pad 4 to bond the chip 3 to the die pad 4. The connecting members 10 electrically couple the bonding pads 5 of the chip 3 with the inner leads 6, and the mold body 13 seals or packages the overall structure except for the outer leads 7.

In the semiconductor package of FIG. 6, the chip 3 bonded to the die pad 4 is smaller than the inner area of the line connecting the front end of the inner lead 6. The coined surface of the respective inner lead 6 enhances bonding between one end of the connecting members 10 such as gold wires and bonding surfaces of the corresponding inner leads preferably by means of wire bonding.

Further, the coined surface of the inner lead 6 is plated with a metal thin film having excellent electric conductivity. Ag is desirably used as the metal thin film.

The insulating member 11 is formed on the coined surface 9 of the inner lead 6 to prevent the chip 3 from being electrically coupled with the inner lead 6. The insulating member 11 can be omitted in case where the size of the chip is smaller than the die pad. However, an insulating member 11 attached on the inner lead 6 is disposed on the same plane as the epoxy 12 doped on the die pad 4.

FIG. 7 is a longitudinal cross-section of a second semiconductor package with the first preferred embodiment of the lead frame where the size of the chip is larger than the inner area of the inner lead 6. The semiconductor package according to FIG. 7 has a semiconductor chip 3 bonded on the die pad 4 with an area larger than the inner area connecting the front ends of the inner leads 6. Thus, edges of the chip 3 overlap the inner lead 6. Again, the chip 3 has a plurality of bonding pads 5 electrically coupled with the inner leads 6, and a mold body 13 seals the overall structure except for the outer leads 7.

In the same manner as the semiconductor package shown in FIG. 6, coining is performed in the front ends of the inner leads 6 to flatten the upper surfaces of the inner leads 6 and at the same time to form a step to enhance wire bonding. Further, the insulating member 11 is attached on the coined surface 9 of the inner lead 6 to prevent the chip 3 from electrically coupling with the inner lead 6. The insulating member 11 preferably includes the bond layer 11a attached on the inner lead 6, and the insulating film 11b attached on the bond layer 11a. The insulating member 11 attached on the inner lead 6 is disposed on the same plane as the epoxy 12 doped on the die pad 4. It is preferable that Ag-epoxy is used as the epoxy 12 and the gold wires are used as the connecting members 10.

Figure 9:
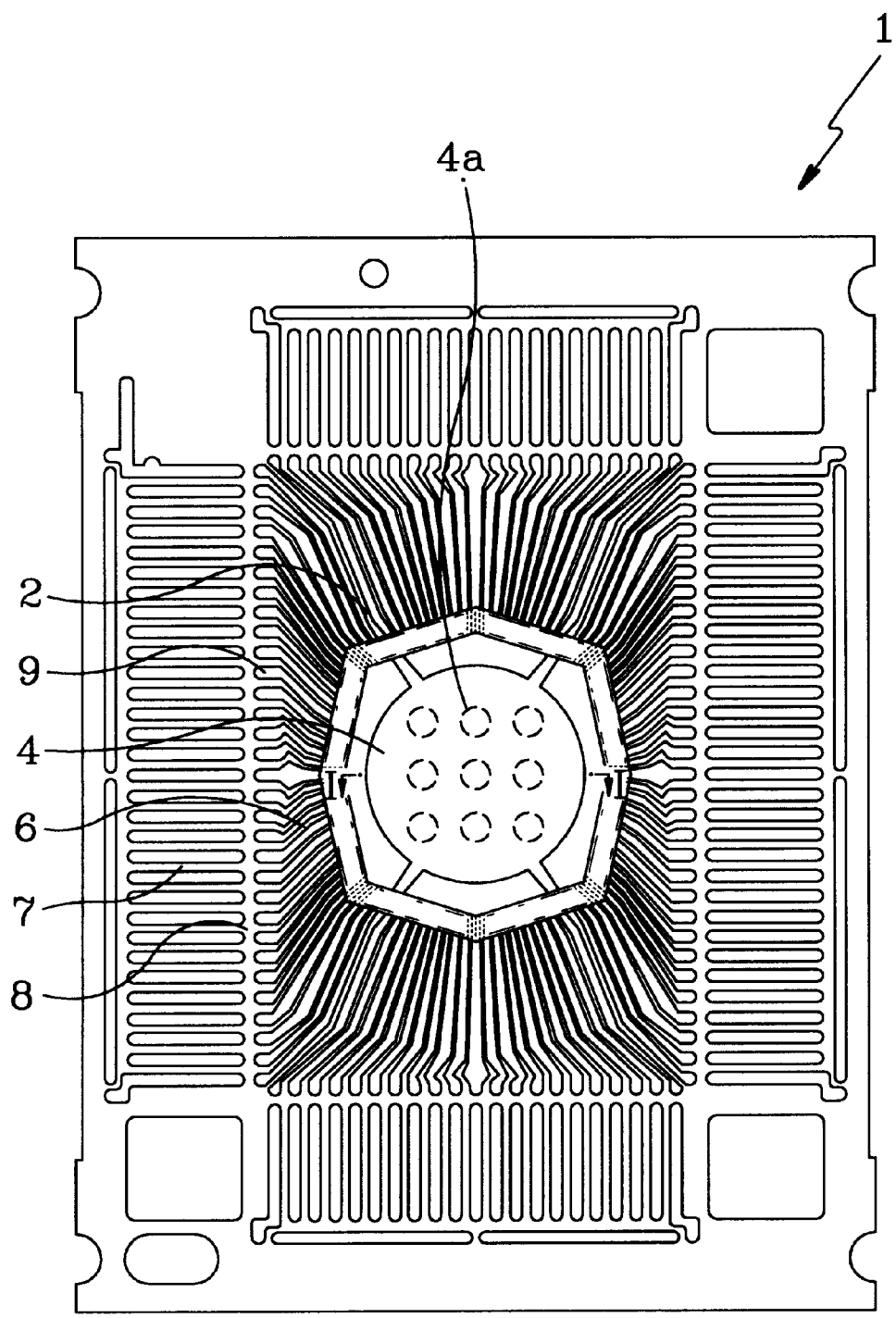
FIG. 9 is a diagram showing a plane view of another preferred embodiment of a lead frame according to the present invention.
Figure 10:
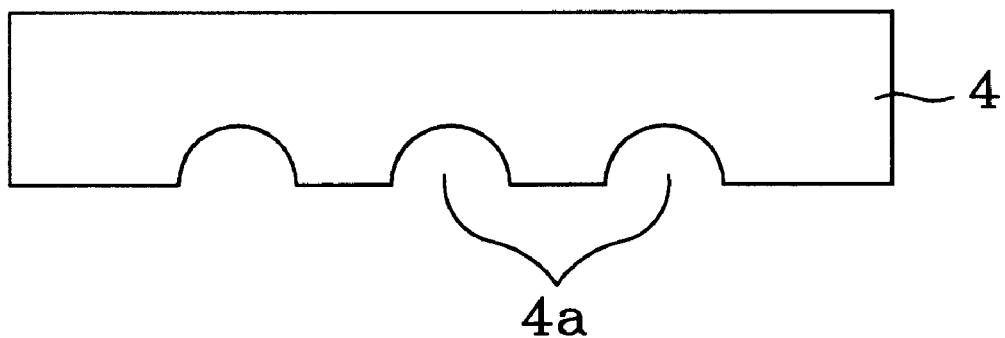
FIG. 10 is a diagram showing a cross-section along line I—I of FIG. 9.

FIG. 9 is a diagram showing a plane view of a second preferred embodiment of a lead frame according to the present invention. FIG. 10 shows a sectional view taken along line I—I of FIG. 9. In the second preferred embodiment, the die pad 4 has a round shape to uniformly disperse stress between the die pad 4 and the chip 3 during chip bonding. The size of the die pad 4 is preferably 15~40% of the chip area. A plurality of dimple grooves 4a are formed at the rear of the die pad 4 to increase a contact area between an epoxy molding compound (EMC) for use in the mold body 13 and the die pad 4. The grooves 4a may also be formed at the rear of the die pad 4 in the first preferred embodiment of the present invention.

The semiconductor packaging processes with the second preferred embodiment of the lead frame shown in FIGS. 9 and 10 is similar to the first preferred embodiment. Accordingly, a detailed description will be omitted.

In the semiconductor package with the lead frames according to the first and second preferred embodiments, since the die pad 4 is not down-set, the mold body 13 is relatively thicker than a package molded with the related art lead frame in which the die pad is down-set. As a result, the semiconductor package with the lead frame according to the first and second embodiments have increased reliability because of increased tolerance to external stress relative to the related art semiconductor package with the down-set lead frame.

In other words, during moisture resistance test (MRT) moisture of the epoxy is expanded by mounting temperature or infrared ray reflow temperature to cause internal pressure. In this case, semiconductor packages suffer from stress. The stress of the semiconductor package is obtained by an equation, $K(a/t)^2 P$, where $K=b/a$. In this equation, a is the length of a long side of the die pad, b is the length of a short side of the die pad, t is the thickness of the lower mold body, i.e., from the bottom of the die pad 4 to the bottom of the mold body 13, and P is the pressure when moisture of the epoxy during MRT is expanded in the course of soldering.

In the above equation, the stress of the semiconductor package is inversely proportional to $t^2$. Accordingly, as the thickness t of the lower mold body increases, the stress of the package decreases. Thus, cracks and the like are decreased according to the first and second preferred embodiments. Therefore, the semiconductor package with the lead frame according to the first and second embodiments of the present invention have an increased resistance against stress such as radius stress of the package.

Figure 11:
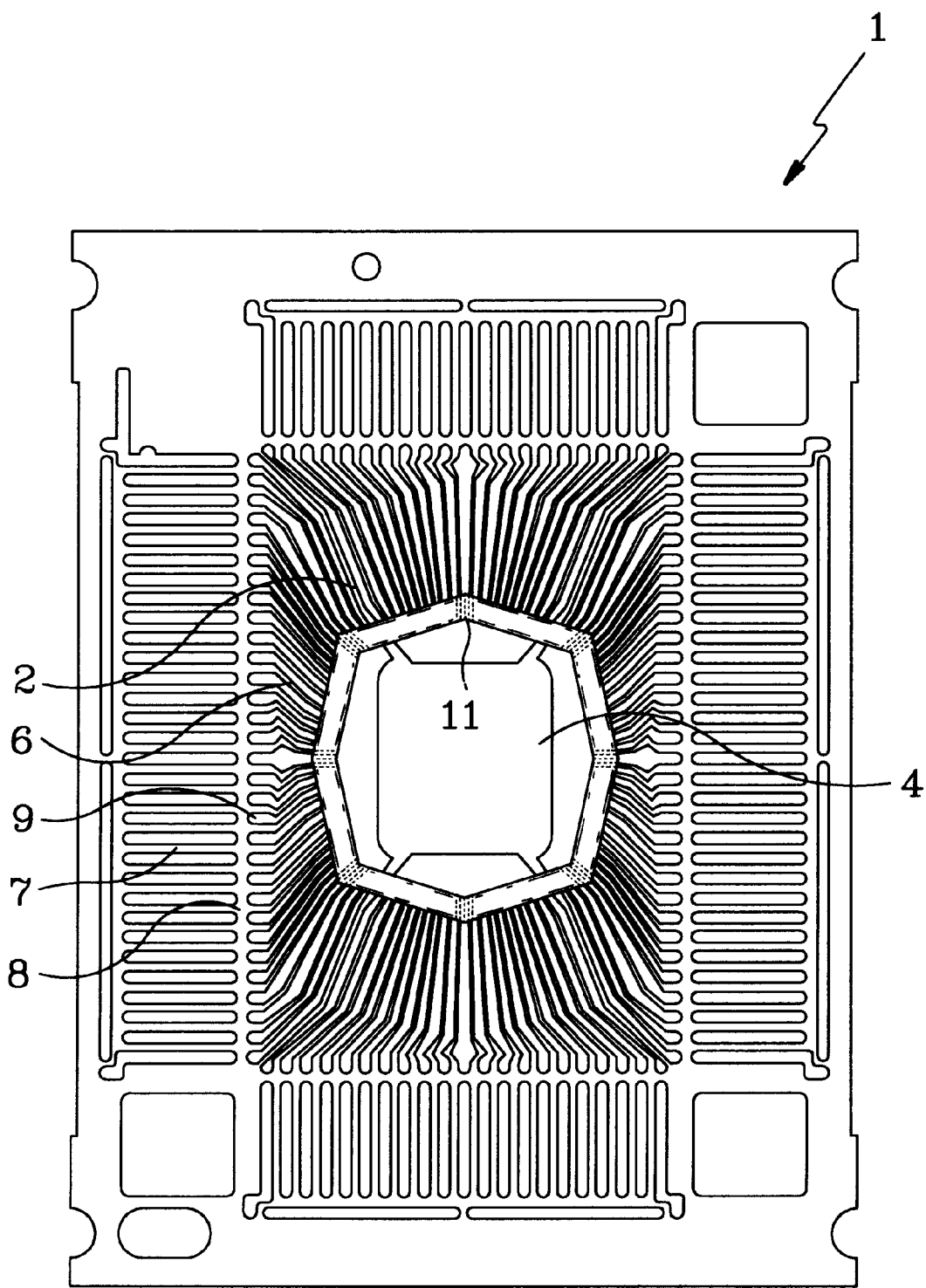
FIG. 11 is a diagram showing a plane view of another preferred embodiment of a lead frame according to the present invention.

FIG. 11 is a diagram showing a plane view of a third preferred embodiment of a lead frame according to the present invention. As shown in FIG. 11, the third preferred embodiment of the lead frame 1 includes a plurality of tie bars 2 extended toward a center from edges of a lead frame body and a die pad 4 coupled with the tie bars 2 to be supported by the tie bars 2 on which a semiconductor chip 3 can be bonded. A plurality of inner leads 6 are disposed around the die pad 4 and electrically coupled with bonding pads 5 of the chip 3 preferably by means of wire bonding. A plurality of outer leads 7 are respectively coupled to the inner leads 6 and exposed outside mold body 13 and a dam bar 8 is formed between the inner leads 6 and the outer leads 7. The inner lead 6 and the tie bar 2 neighboring the dam bar 8 are bent to allow the inner lead 6 and the die pad 4 to be disposed lower than the other portions of the lead frame 1. The inner lead 6 and the die pad 4 are preferably disposed on the same plane.

Figure 12:
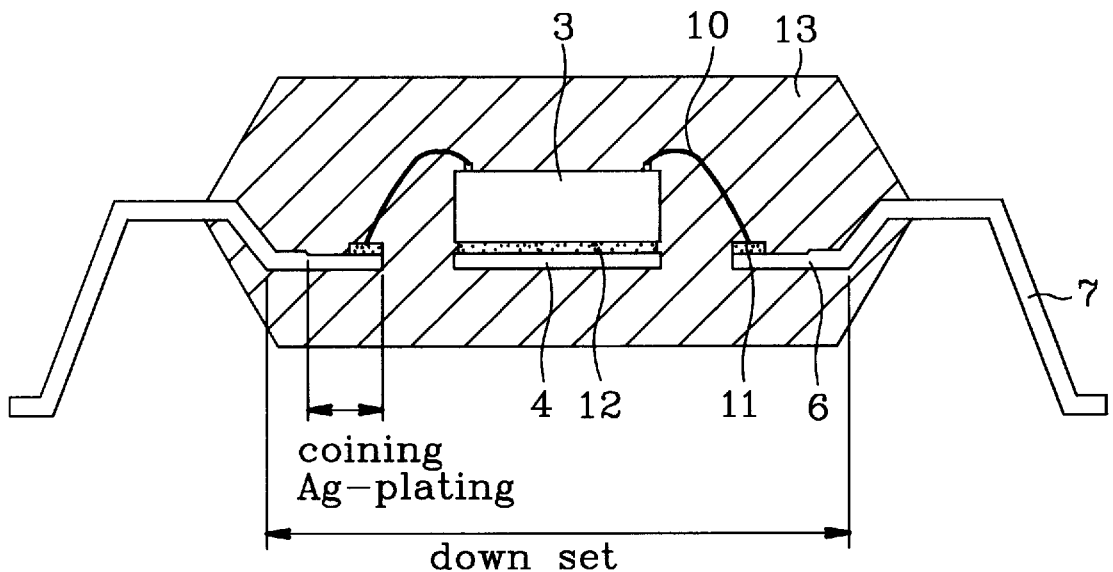
FIG. 12 is a diagram showing a longitudinal cross-section of a semiconductor package with the lead frame of FIG. 11.

As shown in FIG. 12, coining is performed in the down-set portion of the inner lead 6 to flatten the upper surface of the inner lead 6 and at the same time to form a coined surface 9 having a step. As a result, bonding between one end of connecting members 10 such as gold wires and boding portions of the inner leads 6 can be enhanced during wire bonding. The insulating member 11 attached on the inner lead 6 has the same height as the epoxy 12 doped on the die pad 4. For this, a sum of the thickness of the inner lead 6 having the coined surface 9 and the thickness of the insulating member 11 should preferably be equal to a sum of the thickness of the die pad 4 and the thickness of the epoxy 12 doped on the die pad 4.

Further, the coined surface 9 of the inner lead 6 is plated with a metal thin film having excellent electric conductivity. Ag is preferably used as the metal thin film. Thus, Ag-plating is performed in the down-set portion of the inner lead 6 while Ag-plating is not performed in tie bar 2. Further, the insulating member 11 preferably includes a bond layer 11a of polyimide attached on the inner lead 6, and an insulating film 11b attached on the bond layer 11a.

The down-set is formed in such a manner that the inner lead 6 is spaced apart from the dam bar 8 at a distance of 0.3~0.5 mm. The depth of the down-set is about 0.2 mm. The coining depth of the down-set portion is desirably 15~20 μm. Similar to the first preferred embodiment in the third embodiment the insulating member 11 preferably has a thickness of 75 μm or below and a width of 1~1.5 mm. At this time, the bond layer 11a has a thickness of 25 μm or below and the insulating film has a thickness of 50 μm or below. The Ag-epoxy 12 is generally doped on the die pad 4 at a thickness of 8~35 μm. The thickness of the Ag-epoxy, the thickness of the insulating member 11, and the coining depth are properly varied within the above ranges so that the insulating member 11 attached to the inner lead 6 is preferably disposed on the same plane as the epoxy 12 doped on the die pad 4.

The semiconductor packaging process using the third preferred embodiment of the lead frame is similar to the first preferred embodiment. Accordingly, a detailed description is omitted.

FIG. 12 is a diagram showing a longitudinal cross-section of a semiconductor package with the third preferred embodiment of the lead frame in which the size of the chip is smaller than the inner area of the inner lead. As shown in FIG. 12, the semiconductor package includes the plurality of outer leads 7, the plurality of inner leads 6 down-set to be disposed lower than the outer leads 7, the die pad 4 disposed in an inner area of the inner leads 6 and the semiconductor chip 3 bonded on the die pad 4. The plurality of bonding pads 5 of the chip 3 are electrically coupled with the inner leads 6 with the connecting members 10. The epoxy 12 bonds the chip 3 to the die pad 4. The mold body 13 seals the overall structure except for the outer leads 7.

In the semiconductor package using the third preferred embodiment of the lead frame, the chip 3 bonded to the die pad 4 is smaller than the die pad 4. In this case, coining is performed at the down-set portion of the inner leads 5 to flatten the upper surface of the inner leads 6 and at the same time to form a step. On the coined surface 9 of the inner leads 6, one end of the connecting member 10 are preferably wire bonded to the inner leads 6. Further, the down-set portion of the inner lead 6 is plated with a metal thin film having excellent electric conductivity. The insulating member 11 is formed between the down-set portion of the inner leads 6 and the chip 3 to prevent the chip 3 from electrically coupling with the inner leads 6. The insulating member 11 attached on the inner lead 6 is disposed on the same plane as the epoxy 12 doped on the die pad 4.

Figure 13:
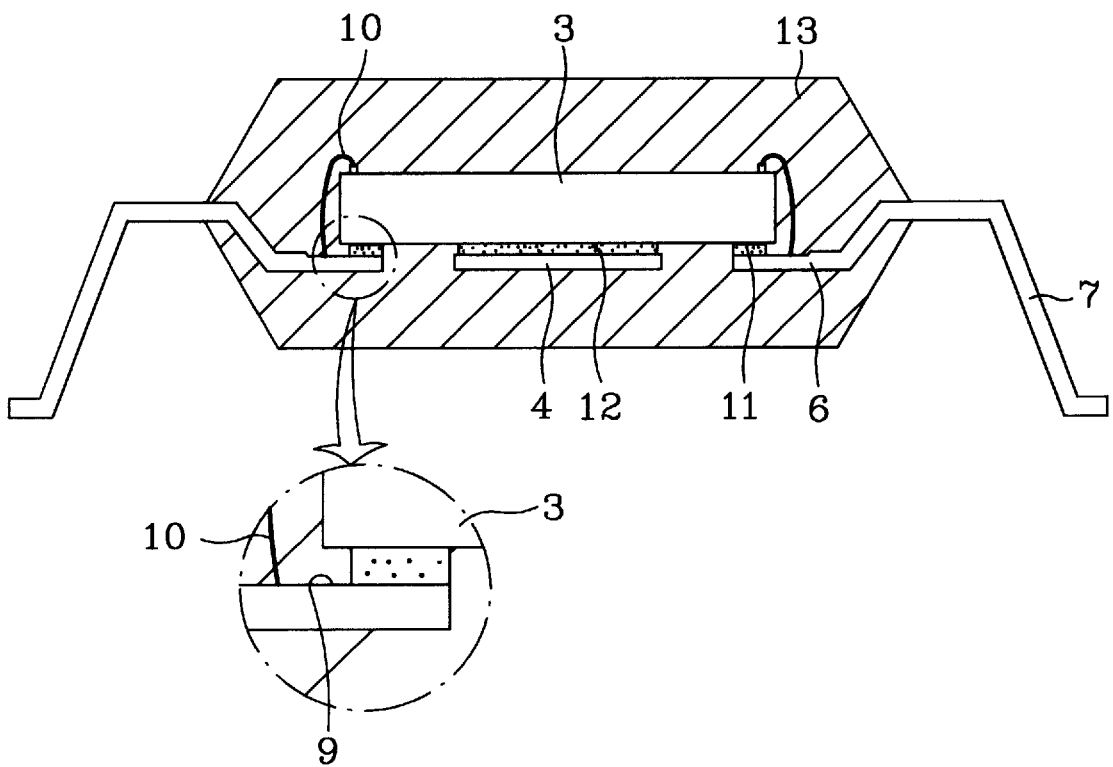
FIG. 13 is a diagram showing a longitudinal cross-section of another semiconductor package with the lead frame of FIG. 11.

FIG. 13 is a diagram showing a longitudinal cross-section of another semiconductor package with the third preferred embodiment of the lead frame according to the present invention where the size of the chip is larger than the inner area of the inner lead. As shown in FIG. 13, coining is performed at the down-set portion of the inner leads 5 to flatten the upper surface of the inner lead 6 and at the same time to form a step. The coined surface 9 of the inner lead 6 enhances bonding between one end of the connecting members 10 and boding portions of the inner leads 6. Further, the coined surface 9 of the inner lead 6 is preferably plated with a metal thin film having excellent electric conductivity.

The insulating member 11 is formed between the down-set portion of the inner leads 6 and the chip 3 to prevent the chip 3 from electrically coupling with the inner leads 6. The insulating member 11 preferably includes a bond layer 11a attached on the inner lead 6, and an insulating film 11b attached on the bond layer 11a. The insulating member 11 attached on the inner lead 6 is preferably disposed on the same plane as the epoxy 12 doped on the die pad 4.

As described above, the preferred embodiments of the present invention have various advantages. In the preferred embodiments, one lead frame is applicable to package the semiconductor chip having various sizes within the range that the number of the bonding pads formed on the variably sized chips does not exceed the number of the corresponding inner leads. Accordingly, manufacturing time and costs can be reduced, for example, if a stamping tool is provided in fabricating the lead frame. In the related art, to design and fabricate the lead frames per size takes about five months. Thus, the preferred embodiments of the lead frame of the present invention can reduce the designing and fabricating time significantly. Further, where the die pad has a round shape, stress caused by chip bonding can be uniformly dispersed.

According to the preferred embodiments where the chip size is larger than the die pad, the edges of the chip are bonded to the inner lead to prevent poor bonding between the die pad and the chip caused by the difference between thermal expansion coefficients. Thus, delamination between the die pad and the chip is reduced or prevented, and reliability of the semiconductor package is increased.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A lead frame, comprising:
   a plurality of tie bars extending toward a center from edges of a lead frame body;
   a die pad supported by the tie bars;
   a plurality of inner leads disposed around the die pad, wherein the die pad and the inner leads are in a single plane;
   an insulating member on the inner leads, wherein the insulating member includes a bond layer attached to inner leads, and an insulating film attached on the bond layer;
   a bonding member on the die pad, wherein a first height from a bottom surface of the die pad to a top surface of the bonding member is substantially equal to a second height from a bottom surface of each of the inner leads to a top surface of a corresponding insulating member; and
   a plurality of outer leads respectively connected with the inner leads.

2. The lead frame of claim 1, wherein the plurality of inner leads are disposed at prescribed intervals surrounding four sides of the die pad.

3. The lead frame of claim 1, further comprising a dam bar formed between the inner leads and the outer leads, wherein front ends of the inner leads are coined to form a flattened step, and wherein a coined surface of the respective inner leads is plated with a metal thin film.

4. The lead frame of claim 1, wherein the inner leads are down-set to be disposed lower than the outer leads, and wherein the die pad is down-set so that the inner leads and the die pad are disposed on the same plane.

5. The lead frame of claim 1, further comprising:
   a semiconductor chip bonded on the die pad, wherein the inner leads are electrically coupled to bonding pads of the chip by wires, wherein the lead frame is adapted to mount the chip being each of a first chip type mounted on the bonding member that does not overlap the inner leads and a second chip type mounted on the bonding member and the insulating members that does overlap the inner leads; and
   a molded body packaging the die pad, the chip, the wires, the inner leads and the outer leads, wherein the outer leads extend outside the molded body.

6. A semiconductor package, comprising:
   a plurality of outer leads;
   a plurality of inner leads internally extended from the outer leads;
   a die pad disposed within a prescribed area defined by front ends of the inner leads, wherein the inner leads and the die pad are in a plane;
   a semiconductor chip bonded to the die pad, wherein the chip has a plurality of bonding pads;
   connecting members that electrically couple the bonding pads of the chip with the inner leads; and
   a mold body that packages the die pad, the chip, the inner leads, the connecting members and the outer leads, wherein the outer leads extend outside the mold body, wherein the inner leads are down-set to be disposed lower than the outer leads, and wherein the die pad is down-set so that the inner leads and the die pad are disposed in the same plane.

7. The semiconductor package of claim 6, wherein semiconductor package mounts the chip being selectively both of a first chip type bonded on the die pad that is smaller than the prescribed area defined by front ends of the inner leads and a second chip type bonded on the die pad and the inner leads that is larger than the prescribed area defined by the front ends of the inner leads so that chip edges overlap the inner leads, wherein the first chip type is mounted on the die pad and the second chip type is mounted on the die pad and the inner leads.

8. The semiconductor package of claim 6, wherein the semiconductor chip bonded on the die pad is larger than the prescribed area defined by the front ends of the inner leads so that edges overlap the inner leads.

9. The semiconductor package as claimed in claim 8, wherein on a coined surface of the inner leads, an insulating member is attached to prevent the chip from electrically contacting the inner leads.

10. The semiconductor package of claim 9, further comprising a bonding member that bonds the chip to the die pad, wherein the top surface of the insulating member is disposed on the same plane as the top surface of the bonding member.

11. The semiconductor package of claim 10, wherein the bonding member is Agepoxy.

12. The semiconductor package of claim 6, wherein front portions of the inner leads are coined to form a flattened step, and wherein a coined surface of the respective inner leads is plated with a metal thin film.

13. The semiconductor package of claim 6, wherein the die pad has a round shape.

14. The semiconductor package of claim 6, wherein a plurality of grooves are formed at the bottom of the die pad to increase a contact area between an epoxy molding compound for use in the mold body and the die pad.

15. The semiconductor package of claim 9, further comprising:

an insulating member on each of the inner leads; and a bonding member on the die pad, wherein a first height from a bottom surface of the die pad to a top surface of the bonding member is substantially equal to a second height from a bottom surface of said each of the inner leads to a top surface of a corresponding insulating member.

16. A lead frame, comprising:

a plurality of tie bars extending toward a center from edges of a lead frame body;

a die pad supported by the tie bars;

a plurality of inner leads disposed around the die pad, wherein the die pad and the inner leads are in a single plane, wherein front ends of the inner leads are coined to form a flattened step, and wherein a coined surface of the respective inner leads is plated with a thin metal;

an insulated member on the inner leads;

a bonding member on the die pad, wherein a first height from a bottom surface of the die pad to a top surface of the bonding member is substantially equal to a second height from a bottom surface of each of the inner leads to a top surface of a corresponding insulating member;

a plurality of outer leads respectively connected with the inner leads; and a dam bar formed between the inner leads and the outer leads.

17. A lead frame, comprising:

a plurality of tie bars extending toward a center from edges of a lead frame body;

a die pad supported by the tie bars;

a plurality of inner leads disposed around the die pad, wherein the die pad and the inner leads are in a single plane;

an insulating member on the inner leads;

a bonding member on the die pad, wherein a first height from a bottom surface of the die pad to a top surface of the bonding member is substantially equal to a second height from a bottom surface of each of the inner leads to a top surface of a corresponding insulating member; and a plurality of outer leads receptively connected with the inner leads, wherein the inner leads are down-set to be disposed lower than the outer leads, and wherein the die pad is down-set so that the inner leads and the die pad are disposed on the same plane.

* * * * *